United States Patent [19]
Lesea

[11] Patent Number: 6,144,225
[45] Date of Patent: Nov. 7, 2000

[54] PROGRAMMABLE INTEGRATED CIRCUIT HAVING METAL PLATE CAPACITORS THAT PROVIDE LOCAL SWITCHING ENERGY

[75] Inventor: Austin Lesea, Los Gatos, Calif.

[73] Assignee: Xilinx, Inc., San Jose, Calif.

[21] Appl. No.: 09/261,105

[22] Filed: Mar. 3, 1999

[51] Int. Cl.$^7$ ............................ H03K 19/00; H01L 25/00
[52] U.S. Cl. ............................ 326/105; 326/47; 327/564
[58] Field of Search ..................... 326/101, 47; 327/564, 327/565

[56] References Cited

U.S. PATENT DOCUMENTS

| | | | |
|---|---|---|---|
| 4,774,421 | 9/1988 | Usui | 327/538 |
| 5,629,838 | 5/1997 | Knight et al. | 361/782 |
| 5,717,359 | 2/1998 | Matsui et al. | 327/565 |
| 5,815,026 | 9/1998 | Santin et al. | 327/536 |
| 5,926,061 | 7/1999 | Usui | 327/538 |

OTHER PUBLICATIONS

"The Programmable Logic Data Book 1998", published by Xilinx, Inc., located at 2100 Logic Drive, San Jose, California 95124, pp. 4–29 to 4–40.

*Primary Examiner*—Michael Tokar
*Assistant Examiner*—James H. Cho
*Attorney, Agent, or Firm*—T. Lester Wallace; Edel M. Young

[57] ABSTRACT

Certain digital logic elements within the core of a field programmable integrated gate array (FPGA) require relatively large spikes of supply current when they switch. Local integrated metal plate bypass capacitors are provided in the core of the FPGA near the digital logic elements. The local integrated bypass capacitors provide the digital logic elements with a substantial portion of the required spikes of supply current. The magnitude of supply current spikes drawn over resistive and/or inductive power leads from the edges of the FPGA is therefore reduced and associated drops in supply voltage at the core are reduced.

15 Claims, 5 Drawing Sheets

PROGRAMMABLE INTEGRATED CIRCUIT HAVING METAL PLATE CAPACITORS THAT PROVIDE LOCAL SWITCHING ENERGY

FIELD OF THE INVENTION

This invention relates generally to methods and circuit configurations for providing local on-chip bypass capacitors that supply spikes of supply current to associated digital logic elements.

BACKGROUND INFORMATION

Figure 1:
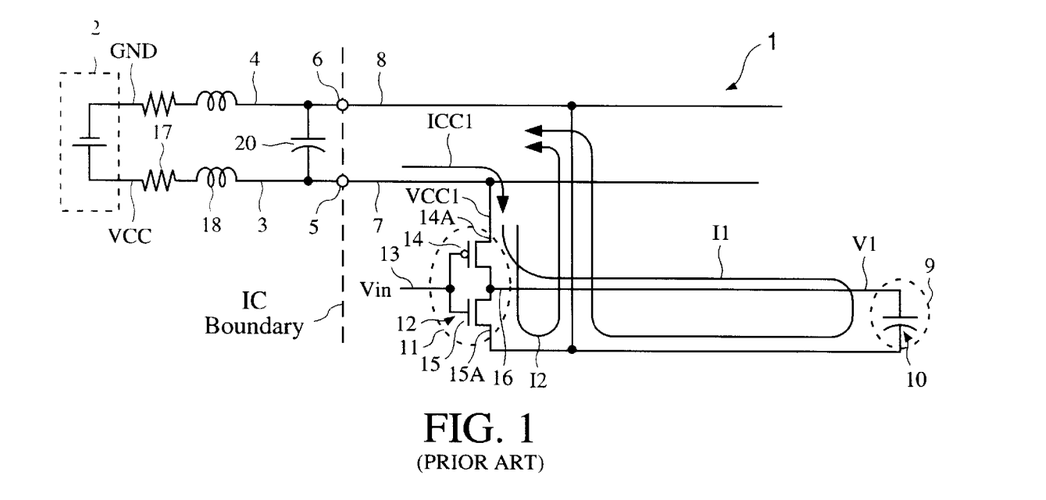
FIG. 1 (Prior Art) is a circuit diagram of an integrated circuit and a bypass capacitor mounted on a printed circuit board.

FIG. 1 (Prior Art) is a circuit diagram illustrating an integrated circuit 1 mounted on a printed circuit board. Integrated circuit 1 receives power from a voltage supply 2 via conductors 3 and 4, VCC power terminal 5 and ground terminal 6, and internal power and ground buses 7 and 8. Integrated circuit 1 includes a first digital logic element 9 (an input of which is represented here as a capacitive load 10) and a second digital logic element 11. The second digital logic element 11 drives digital logic signals onto the input of the first digital logic element. In the illustrated example, the second digital logic element 11 is a complementary metal oxide semiconductor (CMOS) inverter 12. Inverter 12 includes a signal input lead 13, a P channel pullup transistor 14, an N channel pulldown transistor 15, and a signal output lead 16, a supply voltage terminal 14A, and a ground terminal 15A.

Figure 2A:
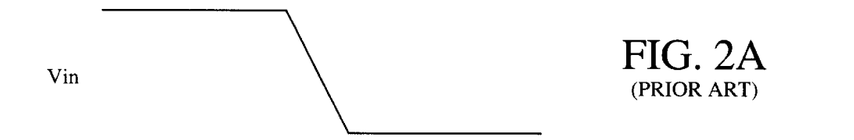
FIGS. 2A–2F (Prior Art) are simplified waveform diagrams that are illustrative of voltages and currents in the circuit of FIG. 1.
Figure 2B:
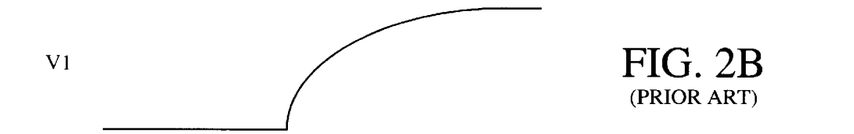

Consider a situation in which inverter 12 switches such that a voltage on capacitive load 10 switches from a digital logic low (for example, zero volts) to a digital logic high (for example, 3.3 volts). Initially, as shown in FIG. 2A, the voltage Vin on the input lead 13 of inverter 12 is a digital logic high. P channel transistor 14 is therefore nonconductive and there is no current draw through P channel transistor 14 from internal power bus 7. Because Vin is a digital logic high, N channel transistor 15 is conductive. Capacitive load 10 is therefore maintained in a discharged state by N channel transistor 15. As shown in FIG. 2B, the voltage V1 across capacitive load 10 is zero while Vin remains low.

Figure 2C:
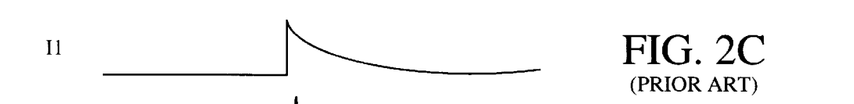

The voltage Vin then switches from a digital logic high to a digital logic low as illustrated in FIG. 2A. P channel transistor 14 turns on and N channel transistor 15 turns off. With P channel transistor 14 conductive, a current I1 flows from internal power bus 7 through P channel transistor 14 and charges capacitive load 10. This current I1 is illustrated in FIG. 2C.

Figures 2D, 2E:
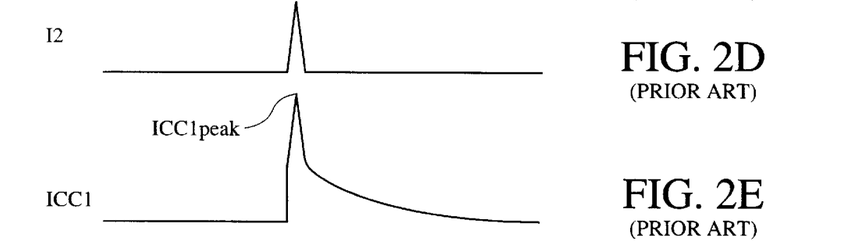

There is, however, a short period of time in which P channel transistor 14 is somewhat conductive before N channel transistor 15 has turned off completely. The result is a spike of current I2 that flows from internal power bus 7, from source to drain through P channel transistor 14, from drain to source through N channel transistor 15, and to internal ground bus 8. The resulting current spike is illustrated in FIG. 2D. The total supply current ICC1 drawn by inverter 12 is the combination of currents I1 and I2. This total supply current ICC1 is illustrated in FIG. 2E.

Figure 2F:
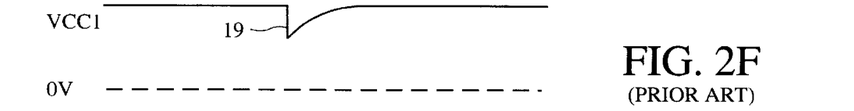

If there were no resistance or inductance between voltage supply 2 and power terminal 5, then this spike of current could be supplied to integrated circuit 1 without dropping the voltage on VCC power terminal 5. There is, however, a resistance and inductance associated with conductor 3. In FIG. 1, this resistance and inductance is represented by resistor 17 and inductor 18. If a spike of current were drawn across resistor 17 and inductor 18, the result would be an undesirable dip in the voltage at VCC power terminal 5. This undesirable dip 19 is illustrated in FIG. 2F.

To prevent such an undesirable dip in the voltage across power and ground terminals 5 and 6, a capacitor 20 is provided near the power and ground terminals. When the short spike of current is demanded by the integrated circuit, capacitor 20 supplies the needed spike of current thus preventing the voltage dip associated with drawing the spike of current across resistance 17 and inductance 18. After the spike of current has been supplied and the current needs of the digital logic element 11 have subsided, the charge given up by capacitor 20 is replenished from voltage supply 2.

The capacitance C needed is determined using the following equation:

$$ICC1peak = C\frac{dV}{dt} \qquad (equ.1)$$

The dV in this equation is the magnitude of the permissible voltage dip on internal power bus 7. For this example, the maximum voltage dip permitted on internal power bus 7 is ten percent of the supply voltage VCC. For a VCC of 3.3 volts, dV is approximately 0.3 volts. The dt in this equation is the time duration of the current spike. In a conventional integrated circuit, an inverter switches on the order of 2 nanoseconds. The dt is therefore approximated to be 2 nanoseconds. The ICC1peak is the peak current drawn by a CMOS inverter in a conventional integrated circuit. This peak current ICC1peak can be 2 milliamperes. Accordingly, the capacitance C needed is roughly 7 picofarads ($7\times10^{-12}$F).

Dielectrics used between metal layers in conventional integrated circuits typically have had dielectric constants of about four. Metal layers have typically been separated by one micron ($10^{-6}$ meters) or more. The size of the needed capacitor if realized as a two plate capacitor is given by the following equation:

$$C = k\varepsilon\frac{W \cdot L}{H} \qquad (equ.2)$$

The k in the equation is the dielectric constant of the dielectric separating the capacitor plates. The $\varepsilon$ in the equation is the permittivity constant $8.854\times10^{-12}$ $C^2Nm^2$. The W is the width of the capacitor plates and the L is the length of the capacitor plates. The H is the separation between the capacitor plates. As seen from the equation above, a square (W=L) capacitor of 10 pF would be about 450 microns on a side. Accordingly, the area required to realize the needed capacitor in integrated circuit form has been unrealistically large.

Off-chip discrete capacitors called "bypass capacitors" have therefore been provided on printed circuit boards along with high speed digital integrated circuits. Such a bypass capacitor is placed as close to the integrated circuit as possible so as to bridge the power and ground terminals of the integrated circuit and to supply the integrated circuit with short spikes of current when needed. Capacitor 20 is such a "bypass capacitor".

It is herein proposed that this conventional bypass capacitor technique will be inadequate in certain high current spike situations in the future. This is because FIG. 1 is a simplification. In reality, the internal power and ground buses 7 and 8 on the integrated circuit have significant inherent resistances and inductances.

Figure 3:
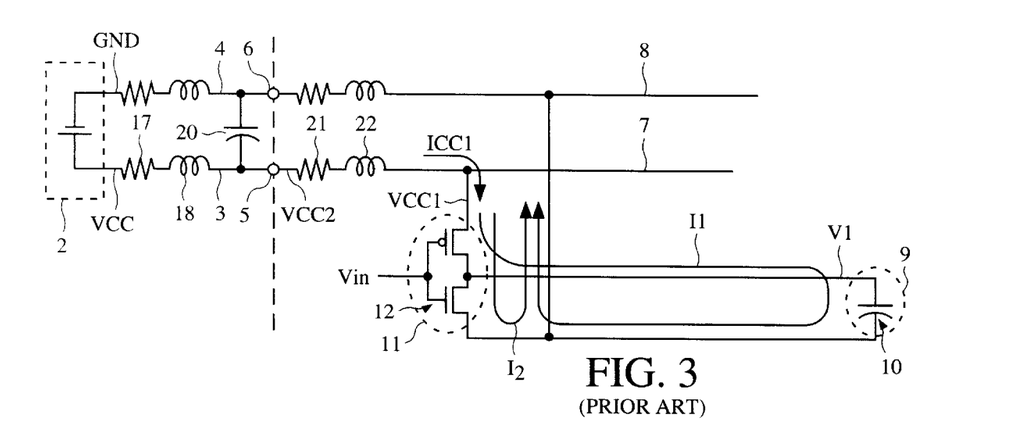
FIG. 3 (Prior Art) is a circuit diagram of the integrated circuit and bypass capacitor of FIG. 1 that models the inherent resistance and inductance of the internal power and ground buses.

FIG. 3 is a circuit diagram illustrating the inherent resistance 21 and inductance 22 of the internal power and ground buses 7 and 8. If the time duration of the ICC1 current spike is short enough and the magnitude of the ICC1 current spike great enough, then a significant voltage drop will develop across resistance 21 and inductance 22. As semiconductor processing technology advances and switching speeds increase, such voltage drops are anticipated to become so great that without other corrective action, voltages on internal power buses will spike below required levels and compromise circuit function. A solution is desired.

SUMMARY

Certain digital logic elements within the core of a field programmable gate array (FPGA) require relatively large spikes of supply current when they switch. One such digital logic element is an inverter in a logic block that drives a digital signal over a relatively long distance to an input lead of another digital logic element in another logic block. In one embodiment, a local bypass capacitor is provided on-chip close to the inverter in layers overlying the transistors of the inverter. When the inverter switches and draws a spike of supply current, a significant portion (greater than half) of this supply current is supplied by the local bypass capacitor. The current supplied by the local bypass capacitor reduces the size of the current spike drawn from an internal power bus. Reducing the size of the current spike drawn from the internal power bus results in a reduction in associated drops in supply voltage on the internal supply bus due to the current spike flowing through the resistance and/or inductance of the internal power bus. When the inverter has finished switching and is no longer drawing the spike of supply current, the local bypass capacitor is recharged via the internal power bus. After the local bypass capacitor has been recharged, it is ready to supply another spike of supply current to the inverter when the inverter switches the next time.

Other structures and methods are disclosed in the detailed description below. This summary does not purport to define the invention. The invention is defined by the claims.

DETAILED DESCRIPTION

Figure 4:
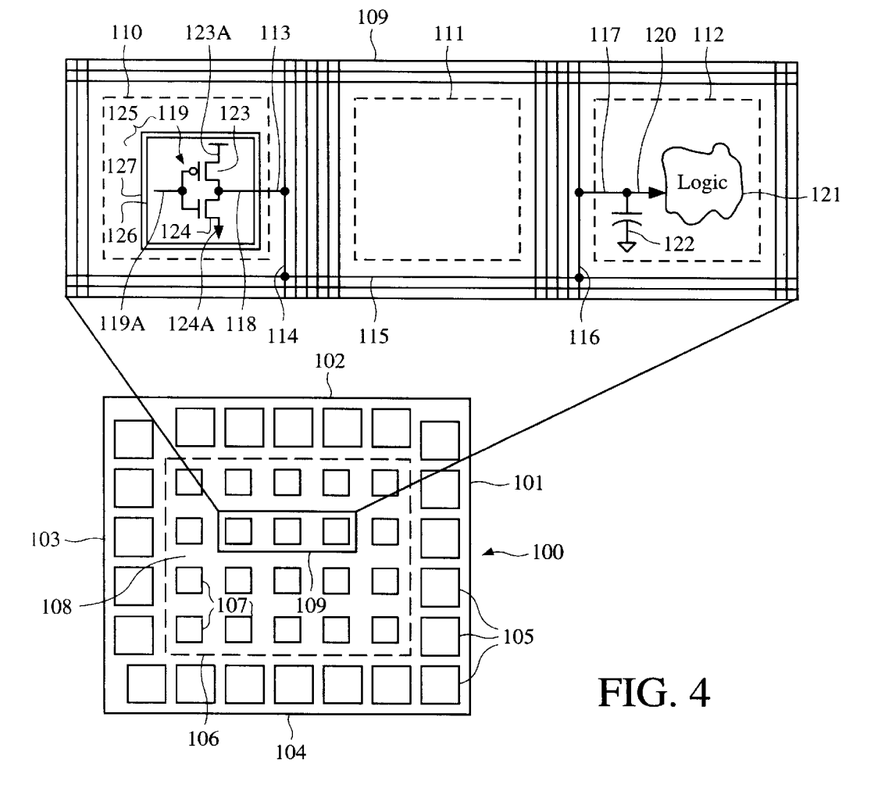
FIG. 4 is a simplified top-down diagram of a field programmable gate array (FPGA) integrated circuit chip in accordance with an embodiment of the present invention.

FIG. 4 is a diagram of a field programmable gate array (FPGA) integrated circuit chip 100 in accordance with an embodiment of the present invention. Integrated circuit chip 100 is rectangular and has four edges 101–104. Integrated circuit chip 100 realizes an integrated circuit that includes a ring of input/output cells (I/O cells) 105 and a core 106 of logic blocks 107. Selected logic elements of the I/O cells and logic blocks can be connected together as desired using a programmable interconnect structure 108. Although programmable interconnect structure 108 is illustrated here as occupying areas between logic blocks, it is understood that the interconnect structure may extend over circuitry of the logic blocks in some embodiments. The programmable interconnect structure can be any one of numerous suitable programmable interconnect structures including an SRAM-based programmable interconnect structure, an EEPROM-based programmable interconnect structure, an EPROM-based programmable interconnect structure, a ROM-based programmable interconnect structure, a DRAM-based programmable interconnect structure, and an antifuse-based programmable interconnect structure. For additional information on one suitable programmable interconnect structure, see: "The Programmable Logic Data Book 1998", pages 4–29 to 4–40, published by Xilinx, Inc., 2100 Logic Drive, San Jose, Calif. 95124 (1998).

The exploded portion 109 of FIG. 4 illustrates three logic blocks 110–112 in greater detail. Each logic block is laid out as a square with sides measuring approximately 200 microns. A relatively long signal path consisting of conductors 113 through 117 extends from an output lead 118 of a logic element 119 in logic block 110, around an intervening logic block 111, and to an input lead 120 of a logic element 121 in logic block 112. The length of this signal path and the input capacitance of logic element 121 together amount to a significant capacitive loading on the signal path. This capacitive loading is represented by capacitor symbol 122. The length of this signal path in this embodiment is approximately 230 microns.

Digital logic element 119 is a complementary metal oxide semiconductor (CMOS) inverter comprising a P channel pullup transistor 123 and an N channel pulldown transistor 124. Digital logic element 119 has a signal input lead 119A, a signal output lead 118, a supply voltage terminal 123A, and a ground terminal 124A. An integrated two-plate metal bypass capacitor 125 comprising two planar metal plates 126 and 127 is provided locally in logic block 110 directly above the transistors 123 and 124 of the digital logic element 119. First planar metal plate 126 is coupled to the source (the ground terminal) of N channel pulldown transistor 124. Second planar metal plate 127 is coupled to the source (the supply voltage terminal) of P channel pullup transistor 123.

Figure 5:
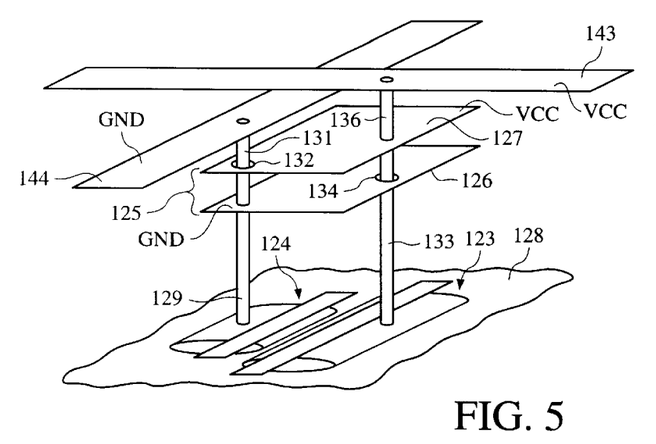
FIG. 5 is a simplified perspective diagram of a local metal plate bypass capacitor and associated digital logic element in the embodiment of FIG. 4.

FIG. 5 is a simplified perspective view of capacitor 125 of FIG. 4. The sources and drains of P channel pullup transistor 123 and N channel pulldown transistor 124 are formed in substrate 128. The source of N channel transistor 124 is connected to first metal plate 126 by an interlayer interconnect structure 129. First metal plate 126 is connected to an overlying ground bus 144 by another interlayer interconnect structure 131. An opening 132 is provided in second metal plate 127 so that interlayer interconnect structure 131 can pass through the plane of second metal plate 127 without contacting the second metal plate 127. In similar fashion, the source of P channel pullup transistor 123 is connected to the second metal plate 127 by an interlayer interconnect structure 133. Interlayer interconnect structure 133 passes through an opening 134 in first metal plate 126 so that interlayer interconnect structure 133 does not make contact with the first metal plate 126. Another interlayer interconnect structure 136 connects second metal plate 127 to an overlying VCC power bus 143.

Although interlayer interconnect structures 129, 131, 133 and 136 are illustrated as slender columnar structures in FIG. 5 for ease of illustration and explanation, interlayer interconnect structures can have multiple different forms and can be made of multiple different materials. In some embodiments, an interlayer interconnect structure involves a conductive metal plug. Such a plug may be formed in conventional fashion by making an opening in a dielectric layer, blanket depositing a layer of metal so as to fill the opening, and then removing the metal outside the opening thereby leaving a metal plug disposed in the opening. In some embodiments, a copper seven metal layer dual-damascene process is used. A two-stepped opening having a shallow portion and a deep portion is formed in a dielectric layer. A metal (for example, copper) is blanket deposited over the structure to fill the entire two-stepped opening. Metal not in the two-stepped opening is then removed (for example, by chemical-mechanical polishing) thereby leaving a capacitor plate in the shallow portion as well as an underlying interlayer conductive plug in the deeper portion. In some embodiments, multiple contacts are provided down to the source of a transistor of logic element 119 (FIG. 4). In some embodiments, interlayer interconnect structures involve multiple layer interlayer interconnects including multiple vertically-extending conductive plugs and multiple horizontally-extending conductors.

Figure 6:
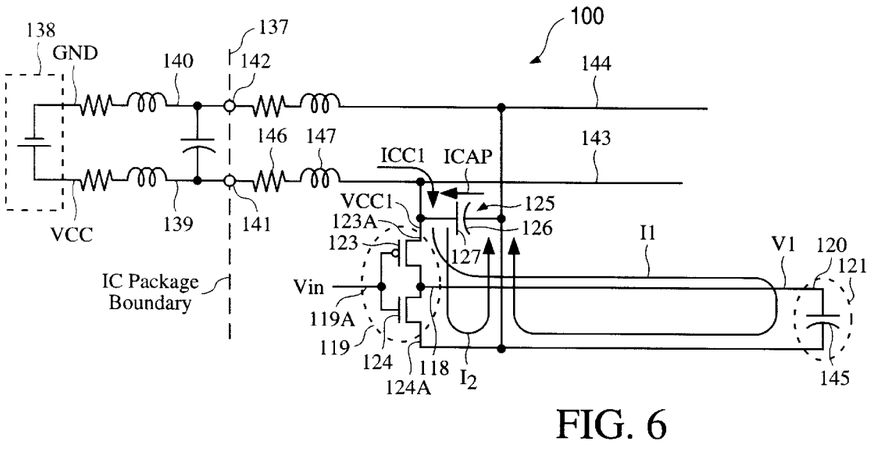
FIG. 6 is a simplified circuit diagram illustrating an operation of the embodiment of FIGS. 4 and 5.

FIG. 6 is a simplified circuit diagram illustrating an operation of the embodiment of FIGS. 4 and 5. Integrated circuit 100 is mounted on a printed circuit board. The two-plate metal bypass capacitor structure 125 of FIG. 5 is represented in FIG. 6 by capacitor symbol 125. Dashed line 137 represents the boundary of a package (for example, a ceramic package) containing integrated circuit 100. Integrated circuit 100 receives power from a voltage supply 138 via conductors 139 and 140, VCC power terminal 141 and ground terminal 142, and internal power and ground buses 143 and 144. The output lead 118 of digital logic element 119 in logic block 110 is coupled to input lead 120 of digital logic element 121 in logic block 112. The capacitance of conductors 113–117 and of the input lead of digital logic element 121 is represented in FIG. 6 as a capacitive load 145.

Figure 7A:
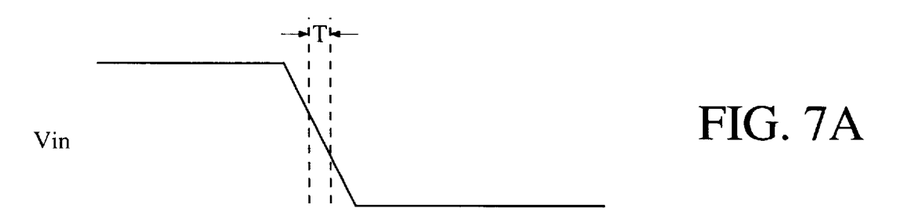
FIGS. 7A–7H are simplified waveform diagrams that are illustrative of voltages and currents in the embodiment of FIGS. 4–6.
Figure 7B:
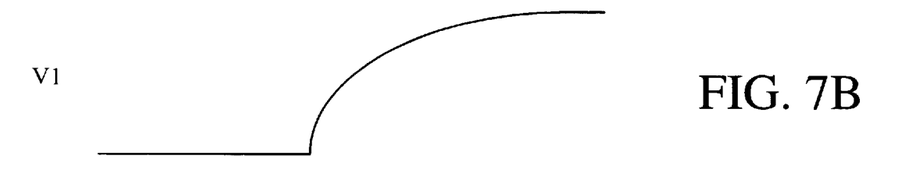

Capacitor 125 is initially charged via power and ground buses 143 and 144 so that voltage VCC (for example, 3.3 volts) is present between plates 126 and 127. As shown in FIG. 7A, the voltage Vin on the input lead of inverter 119 is initially a digital logic high. P channel transistor 123 is therefore nonconductive, N channel transistor 124 is conductive, and capacitive load 145 is maintained in a discharged state. As shown in FIG. 7B, the voltage V1 across capacitive load 145 is zero.

Figure 7C:
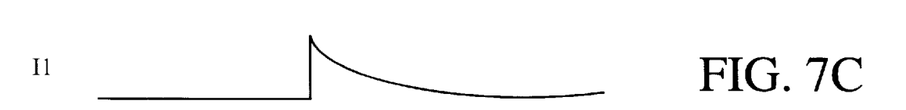
Figure 7D:
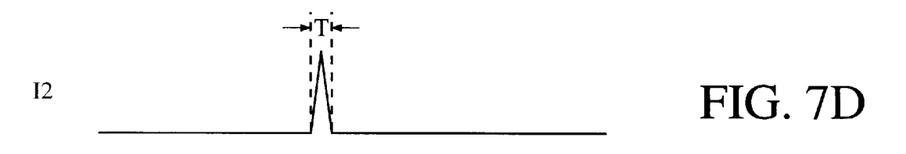
Figure 7E:
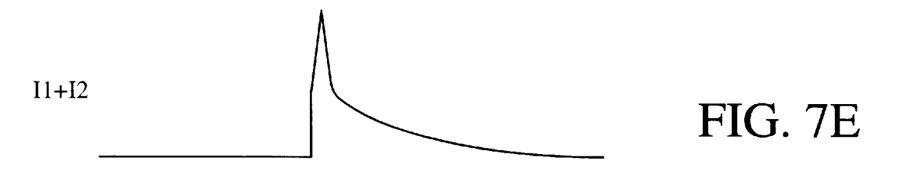
Figure 7F:
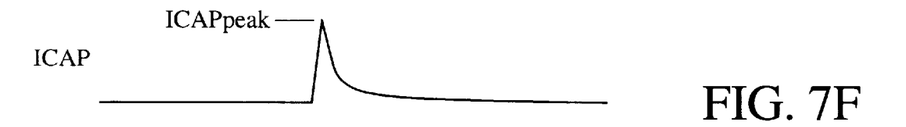

The voltage Vin then switches from a digital logic high to a digital logic low as illustrated in FIG. 7A. P channel transistor 123 turns on and N channel transistor 124 turns off. With P channel transistor 123 conductive, a current I1 flows through P channel transistor 123 and charges capacitive load 145. This current I1 is illustrated in FIG. 7C. For a short period of time when P channel transistor 123 is turning on and N channel transistor 124 is turning off, both transistors are somewhat conductive. During this time period T, a current I2 flows from source to drain through P channel transistor 123 and then from drain to source through N channel transistor 124. The resulting spike of current I2 is illustrated in FIG. 7D. The total current I1+I2 drawn through the P channel pullup transistor 123 is the combination of currents I1 and I2 and is illustrated in FIG. 7E. Total current I1+I2 of FIG. 7E corresponds to the current illustrated in FIG. 2E. In contrast to the prior art situation of FIG. 2E, however, most (more than 50 percent) of this spike of current is supplied by local bypass capacitor 125. FIG. 7F shows the spike of current ICAP supplied by local bypass capacitor 125 to digital logic element 119. The peak value of current ICAP is denoted ICAPpeak.

Figures 7G, 7H:
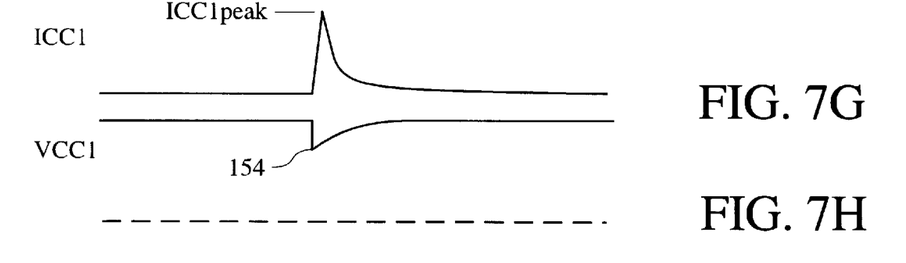

Because capacitor 125 supplies a large portion of the needed current during the period of time T digital logic element 119 is switching, the peak magnitude ICC1peak of current ICC1 that is drawn during time period T from internal power bus 143 is also reduced. The reduced magnitude of peak current ICC1peak is illustrated in FIG. 7G. Because the magnitude of ICC1peak is reduced, the magnitude of the associated voltage drop 154 due to pulling a spike of current ICC1 across lead resistance 146 and lead inductance 147 is also reduced. FIG. 7H illustrates the reduced drop 154 in supply voltage VCC1 on the internal power bus 143. In this embodiment, the supply voltage VCC1 is 1.8 volts and the actual voltage on internal power buses must be within 20 percent of VCC1. The maximum permissible change in voltage on internal power bus 143 is therefore approximately 0.4 volts.

Figure 8:
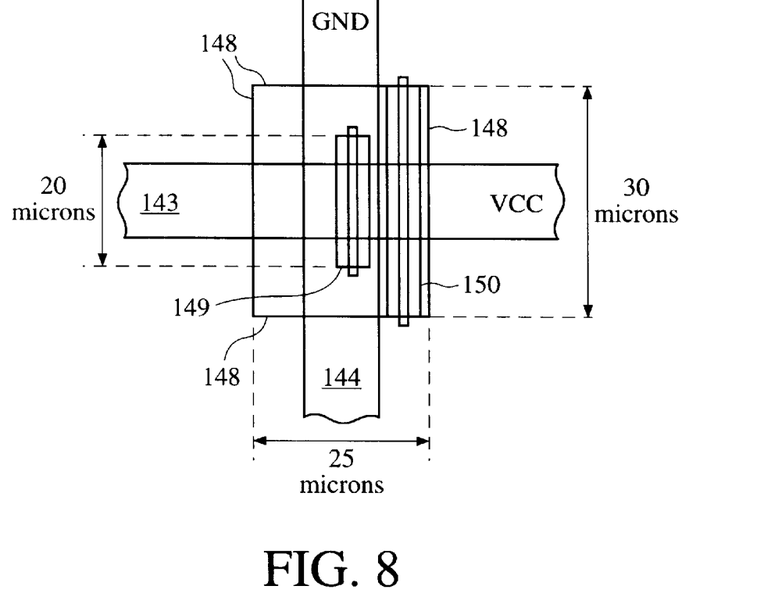
FIG. 8 is a simplified top-down diagram of the structure of FIG. 5.

FIG. 8 is a simplified top-down diagram of the embodiment of FIGS. 4 and 5. Plates 126 and 127 of capacitor 125 are parallel metal plates that have the same rectangular lateral boundary 148 when viewed from the top-down perspective. Plates 126 and 127 are each 25 microns by 30 microns (each has an area of approximately 750 square microns). The source and drain of N channel transistor 124 also define a lateral boundary 149 when viewed from the top-down perspective. N channel transistor 124 has a gate width of 20 microns. Similarly, the source and drain of P channel transistor 123 define a lateral boundary 150 when viewed from the top-down perspective. P channel transistor 123 has a gate width of 30 microns. N channel and P channel transistors 124 and 123 have gate lengths of less than 0.20 microns. In this embodiment, the gate lengths of transistors 124 and 123 are 0.18 microns.

As shown in FIG. 8, the boundaries 149 and 150 of transistors 124 and 123 are contained entirely within the lateral boundary 148 of plates 126 and 127 when viewed from the top-down perspective. The separation between metal layers of integrated circuit 100 is less than 0.75 microns and in this embodiment is approximately 0.5 microns. The dielectric used to separate metal layers is a "low-K" dielectric with a dielectric constant less than four. In this embodiment, the dielectric is $SiO_2F$ and has a dielectric constant of approximately 3.75. The magnitude of the peak current ICAPpeak supplied by capacitor 125 relative to the magnitude of peak current ICAPpeak drawn by digital logic element 119 is approximated using the following equation:

$$C = k\varepsilon \frac{W \cdot L}{H} \qquad (equ.3)$$

The dielectric constant k is 3.75. The permittivity constant $\varepsilon$ is $8.854 \times 10^{-12}$ $C^2/Nm^2$. W is 25 microns. L is 30 microns. H is the 0.5 micron separation between metal layers. The resulting capacitance C is approximately 0.05 picofarads.

The amount of current supplied by capacitor 125 is then approximated by using the above-determined value of C in the following capacitor equation:

$$ICAPpeak = C\frac{dV}{dt} \qquad (\text{equ.}4)$$

The change in voltage dV across the plates of capacitor 125 is the 0.4 volt maximum permissible change in voltage on the internal power bus 143. The dt is the time period T during which the peak current ICAPpeak flows. This time period T is approximated to be the 20 picosecond switching period of the digital logic element 119. (The resistance of the interlayer interconnect structures 129, 133, 131 and 136 is small and is ignored for purposes of this calculation.) The resulting current supplied by capacitor 125 is therefore approximately 1.0 milliampere.

The current drawn through P channel transistor 123 of digital logic element 119 is simulated to be roughly 2.0 milliamperes when driving approximately 230 microns of standard interconnect (a capacitive load of approximately 0.03 pF). Accordingly, the local bypass capacitor structure of FIGS. 4, 5 and 8 supplies roughly half of the peak current drawn by digital logic element 119. The realization of a capacitor on-chip at a location where the peak current is needed is facilitated by the fact that: 1) increased switching speeds have reduced the amount of bypass capacitance needed, and 2) advances in semiconductor processing have increased the capacitance per unit area of integrated capacitors.

In a preferred embodiment, the minimum area of capacitor 125 is the area necessary to supply at least half of the peak current ICC1peak drawn by the associated digital logic element during switching of the associated digital logic element. The maximum area of capacitor 125 is the area of logic block 110 because it is desired to be able to run metal signal lines between adjacent logic blocks using metal of the same metal layer from which the capacitor plates are fashioned. Routing in the top two layers of an integrated circuit is generally a scarce and valuable resource. In a preferred embodiment, the plates 127 and 126 of capacitor 125 are not formed of these top two layers of metal but rather are fashioned from underlying metal layers as illustrated in FIG. 5.

Although the digital logic element 119 is an inverter in the specific embodiment of FIGS. 4, 5 and 8, other digital logic elements can be supplied with spikes of supply current in accordance with the invention. Digital logic element 119 can, for example, be a non-inverting buffer, a multiple-input logic gate or a tri-statable logic gate.

Figure 9:
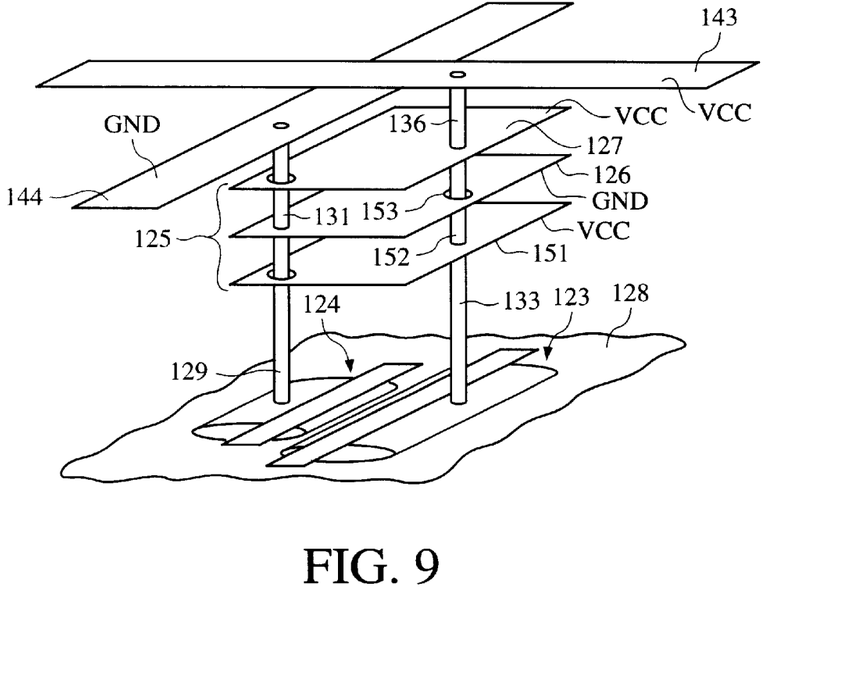
FIG. 9 is a simplified perspective diagram of a three plate embodiment of a local metal plate bypass capacitor in accordance with another embodiment.

FIG. 9 is a perspective view of an embodiment in accordance with the present invention wherein capacitor 125 has a third capacitor plate 151. Plate 127 is connected to third plate 151 by another interlayer interconnect structure 152 that extends through an opening 153 in plate 126. In the capacitor equation below, N is the number of plates.

$$C = K\varepsilon\left(\frac{W \cdot L}{H}\right)(N-1) \qquad (\text{equ.}5)$$

As evidenced by equation 5, increasing the number of plates has the effect of decreasing the area required to realize a capacitor 125 of a given capacitance.

Although the present invention is described in connection with certain specific embodiments for instructional purposes, the present invention is not limited thereto. Although local capacitor 125 is described in connection with a connection in a programmable integrated circuit that extends from one logic block to another logic block, capacitor 125 can be provided as a small local on-chip bypass capacitor to supply brief spikes of current to any circuit that requires brief spikes of supply current. Capacitor 125 sees application in integrated circuits other than programmable integrated circuits. The circuit that requires the brief spikes of supply current need not necessarily be a CMOS logic element. In some embodiments, the same local on-chip bypass capacitor supplies multiple circuits with brief spikes of supply current. These multiple circuits may or may not switch simultaneously. The plates of capacitor 125 and the interlayer interconnections need not be made of metal and can include other conductive materials. A local on-chip bypass capacitor can be realized with plates that extend in the vertical dimension such as parallel metal-filled vertically-extending damascene trenches. A local on-chip bypass capacitor can have more than three plates. Accordingly, various modifications, adaptations, and combinations of various features of the described embodiments can be practiced without departing from the scope of the invention as set forth in the claims.

What is claimed is:

1. An integrated circuit, comprising:
    a capacitor comprising a first planar metal plate and a second planar metal plate, the first planar metal plate having a lateral boundary, the second planar metal plate having a lateral boundary, the first planar metal plate extending in a first plane, the second planar metal plate extending in a second plane, the first plane being parallel to the second plane;
    a power bus extending in a third plane, the third plane being substantially parallel to the first plane and to the second plane, the power bus being coupled to the second planar metal plate of the capacitor;
    a first logic block comprising a first digital logic element; and
    a second logic block comprising a second digital logic element, the second digital logic element having an output lead coupled to an input lead of the first digital logic element, the second logic block having a lateral boundary, the lateral boundaries of the first and second planar metal plates being disposed in the lateral dimension within the lateral boundary of the second logic block, during a switching period of a voltage on the output lead from a first digital logic level to a second digital logic level a peak current ICAPpeak flows from the second planar metal plate of the capacitor and to the second digital logic element, during the switching period a peak current ICCpeak flows from the power bus and to the second digital logic element, ICCpeak being smaller than ICAPpeak.

2. The integrated circuit of claim 1, wherein the second digital logic element has a supply voltage terminal and a ground terminal, the supply voltage terminal being coupled to the second planar metal plate of the capacitor, the ground terminal being coupled to the first planar metal plate of the capacitor, the second digital logic element being a digital logic element taken from the group consisting of: an inverter, a non-inverting buffer, a multiple-input logic gate, and a tri-stable logic gate.

3. The integrated circuit of claim 1, wherein the second planar metal plate occupies a lateral area, the second digital logic element occupying a lateral area, the lateral area occupied by the second planar metal plate being greater than the lateral area occupied by the second digital logic element, the second digital logic element being a digital logic element taken from the group consisting of: an inverter, a non-inverting buffer, a multiple-input logic gate, and a tri-statable logic gate.

4. The integrated circuit of claim 1, further comprising:
   a third logic block disposed between the first logic block and the second logic block.

5. The integrated circuit of claim 1, wherein the first and second planar metal plates of the capacitor are separated by a dielectric material, the dielectric material having a dielectric constant less than 3.75, the first and second planar metal plates of the capacitor being separated by less than 0.75 microns.

6. The integrated circuit of claim 1, wherein the integrated circuit further comprises:
   a ground bus that extends in a fourth plane, the fourth plane extending over the first and second planes.

7. The integrated circuit of claim 1, wherein the power bus extends over at least a portion of the capacitor.

8. The integrated circuit of claim 1, wherein the second digital logic element includes one and only one P channel transistor.

9. The integrated circuit of claim 1, wherein the second digital logic element includes a plurality of P channel transistors.

10. The integrated circuit of claim 1, wherein the second digital logic element has a lateral boundary, the lateral boundary of the second digital logic element being disposed in the lateral dimension substantially within the lateral boundaries of the first and second planar metal plates.

11. The integrated circuit of claim 1, wherein the capacitor further comprises:
    a third planar metal plate, the third planar metal plate being coupled to the first planar metal plate, the third planar metal plate extending in a fourth plane, the fourth plane being parallel to the first and second planes.

12. The integrated circuit of claim 1, wherein the capacitor further comprises:
    a third planar metal plate, the third planar metal plate being coupled to the second planar metal plate, the third planar metal plate extending in a fourth plane, the fourth plane being parallel to the first and second planes.

13. A method of fabricating an integrated circuit, comprising:
    fabricating a digital logic element in a core of the integrated circuit, the digital logic element comprising a P channel pullup transistor, the P channel pullup transistor having a gate length of less than 0.20 microns, a source of the P channel pullup transistor being a supply voltage terminal of the digital logic element;
    fabricating a local parallel plate bypass capacitor in the core of the integrated circuit, the bypass capacitor having a first metal plate and a second metal plate, the second metal plate being coupled to the supply voltage terminal, one of the first and second metal plates being formed of a first layer of metal whereas the other of the first and second metal plates is formed of a second layer of metal, the first and second metal plates being separated by less than 0.75 microns, each of the first and second metal plates occupying an area of at least 750 square microns; and
    fabricating a power supply bus that is formed of a third layer of metal, the power supply bus being coupled to the second metal plate.

14. The method of claim 13, wherein the P channel transistor is disposed entirely underneath the local parallel plate bypass capacitor, the P channel transistor having a source, the source being coupled to the second metal plate of the local parallel plate bypass capacitor, there being one and only one source of a P channel transistor coupled to the second metal plate.

15. The method of claim 13, wherein the digital logic element also has a ground terminal, the method further comprising:
    fabricating a ground bus that is formed of a fourth layer of metal, the ground bus being coupled to the first metal plate of the local parallel plate bypass capacitor, the first metal plate being coupled to the ground terminal of the digital logic element.

* * * * *